(12) United States Patent  
Lee (10) Patent No.: US 8,436,958 B2
(45) Date of Patent: May 7, 2013

(54) ELECTRONIC DEVICE HAVING ORGANIC LIGHT EMITTING DIODE DISPLAY DEVICE

(75) Inventor: Hyun-Hee Lee, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 629 days.

(21) Appl. No.: 12/379,303

(22) Filed: Feb. 18, 2009

(65) Prior Publication Data

US 2009/0207560 A1     Aug. 20, 2009

(30) Foreign Application Priority Data

Feb. 18, 2008   (KR) .................. 10-2008-0014531

(51) Int. Cl.
*G02F 1/1333*    (2006.01)

(52) U.S. Cl.
USPC .............. 349/60; 349/58; 349/40; 349/56; 313/504; 313/506; 313/512; 257/E51.022; 257/686

(58) Field of Classification Search ............ 349/60, 349/58; 257/E51.022; 361/679.01
See application file for complete search history.

(56) References Cited

U.S. PATENT DOCUMENTS

| | | | | |
|---|---|---|---|---|
| 5,710,607 A * | 1/1998 | Iwamoto et al. | ............ | 349/60 |
| 5,929,950 A * | 7/1999 | Matsuda | ............ | 349/60 |
| 6,067,133 A * | 5/2000 | Niibori et al. | ............ | 349/60 |
| 6,838,812 B2 * | 1/2005 | Uchida | ............ | 313/483 |
| 6,847,415 B1 * | 1/2005 | Yoshimura et al. | ............ | 349/58 |
| 7,164,586 B2 * | 1/2007 | Lin | ............ | 361/714 |
| 7,920,225 B2 * | 4/2011 | Nishikawa et al. | ............ | 349/60 |
| 7,944,520 B2 * | 5/2011 | Ichioka et al. | ............ | 349/58 |
| 7,944,521 B2 * | 5/2011 | Ichioka et al. | ............ | 349/58 |
| 8,031,289 B2 * | 10/2011 | Naritomi | ............ | 349/58 |
| 2006/0028594 A1 * | 2/2006 | Chou | ............ | 349/58 |
| 2006/0044490 A1 * | 3/2006 | Ichioka et al. | ............ | 349/58 |
| 2006/0066772 A1 * | 3/2006 | Takahashi et al. | ............ | 349/60 |
| 2006/0209227 A1 * | 9/2006 | Miyamoto | ............ | 349/58 |
| 2007/0002206 A1 * | 1/2007 | Shirai | ............ | 349/58 |
| 2007/0222912 A1 * | 9/2007 | Sato et al. | ............ | 349/58 |
| 2008/0165496 A1 * | 7/2008 | Kang et al. | ............ | 361/692 |
| 2008/0218655 A1 * | 9/2008 | Won et al. | ............ | 349/58 |
| 2009/0015998 A1 * | 1/2009 | Havelka et al. | ............ | 361/681 |

FOREIGN PATENT DOCUMENTS

| | | | |
|---|---|---|---|
| JP | 2007-003858 | * | 1/2007 |
| KR | 2002-0002887 A | | 1/2002 |
| KR | 2006-0084367 A | | 7/2006 |
| KR | 2007-0053517 A | | 5/2007 |
| KR | 2007-0102279 A | | 10/2007 |

\* cited by examiner

*Primary Examiner* — Edward Glick
*Assistant Examiner* — Sang V Nguyen
(74) *Attorney, Agent, or Firm* — Robert E. Bushnell, Esq.

(57) ABSTRACT

An electronic device having an impact resistance property is provided. The electronic device includes an organic light emitting diode (OLED) display device and a housing receiving the OLED display device. The OLED display device includes a panel assembly on which a plurality of OLEDs are formed and a printed circuit board electrically connected to the panel assembly. The housing includes a reinforcing housing having an impact absorption ability and defining first and second spaces, an upper housing disposed within the first space and physically coupled to the reinforcing housing, and a lower housing disposed within the second space and physically coupled to the reinforcing housing. The panel assembly is located in the first space.

16 Claims, 7 Drawing Sheets

ELECTRONIC DEVICE HAVING ORGANIC LIGHT EMITTING DIODE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 18 Feb. 2008 and there duly assigned Serial No. 10-2008-0014531.

BACKGROUND OF THE INVENTION

1. Field of the Invention

The present invention relates to an electronic device having an organic light emitting diode (OLED) display device, and more particularly, to an electronic device having an OLED display device that is designed to absorb the external impact in order to improve an impact resistance property, and to a process of manufacturing that display device.

2. Description of the Related Art

An OLED display device includes a plurality of OLEDs device each having a hole injection electrode made of hole injection material, an organic emission layer, and an electron injection electrode. The OLEDs emit light using energy generated during excitons generated by electron-hole combination in the organic emission layer drop from the excitation state to the ground state.

By the above stated principle, the OLED display devices have a self-emissive characteristic. Therefore, unlike liquid crystal display devices (LCDs), the OLED display devices do not require a separate light source and thus a thickness and weight of the OLED display devices may be reduced. Further, the OLED display devices have a variety of high quality properties such as low power consumption, high luminance, quick response, and the like. Therefore, the OLED display devices are drawing attention as the upcoming alternative display devices for portable electronic devices.

Generally, a typical OLED display devices includes a panel assembly in which OLEDs are formed, a bezel coupled to the panel assembly at a rear side of the panel assembly, and a printed circuit board (PCB) electrically connected to the panel assembly by a flexible printed circuit board (FPCB). Further, a bezel formed of metal may be optionally coupled to the panel assembly in order to enhance mechanical strength of the panel assembly.

A panel assembly of the LCD device includes two substrates and liquid crystal filled in a space defined between the two substrates. Unlike the LCD device, the OLED display device is designed such that empty spaces exist at interior of the panel assembly. Therefore, mechanical strength of the OLED display device may be not sufficient. Particularly, the OLED display device is typically adhered to a housing of an electronic device by a double-sided adhesive tape. The housing receiving the OLED display device, however, may not be provided with any absorption member for absorbing external impacts.

Therefore, when a user accidentally drops the electronic device having the OLED display device, the drop impact (external impact) may be directly transferred from the housing to the OLED display device. Therefore, relatively large torsion load and/or relatively large bending load may be applied to the bezel and thus the bezel is deformed. As a result, the torsion load and/or the bending load are transferred to the panel assembly coupled to the bezel. This may cause the damage of the panel assembly.

The above information disclosed in this Background section is only for enhancement of understanding of the background of the invention and therefore it may contain information that does not form the prior art that is already known in this country to a person of ordinary skill in the art.

SUMMARY OF THE INVENTION

It is therefore one object of the present invention to provide an improved electronic device having an improved OLED display device in order to prevent the OLED display device from being damaged because of the torsion load.

It is another object of the present invention to provide an electronic device having an OLED display device that is designed to absorb the external impacts in order to improve an impact resistance property of the electronic device having the OLED display device.

According to an exemplary embodiment of the present invention, an electronic device includes an OLED display device and a housing receiving the OLED display device. The OLED display device includes a panel assembly on which a plurality of OLEDs are formed, and a printed circuit board electrically connected to the panel assembly. The housing includes a reinforcing housing having an impact absorption function and defining first and second spaces, an upper housing disposed in the first space and coupled to the reinforcing housing, and a lower housing disposed in the second space and coupled to the reinforcing housing. The panel assembly is located in the first space.

The reinforcing housing may include a bottom portion on which the panel assembly is disposed, a first sidewall extending from a side edge of the bottom portion toward the upper housing, and a second sidewall extending from the side edge of the bottom portion toward the lower housing. The first sidewall may be spaced apart from a side surface of the panel assembly by a predetermined gap.

The panel assembly may include a display region and a pad region and the OLED display device may include a flexible printed circuit board located between the pad region and the printed circuit board. The first and second sidewalls may be located at side edges of the bottom portion except for a side edge corresponding to the pad region.

The flexible printed circuit board may be bent toward the second space such that the printed circuit board is located in the second space. The bottom portion may be provided at a surface facing the second space with a groove for receiving the printed circuit board. The electronic device may further include an impact absorption member located between the panel assembly the bottom portion of the reinforcing housing.

The upper housing may include a transparent protecting member corresponding to the display region and an impact absorption tape may be disposed along an outer circumference of the display region between the upper housing and the panel assembly. The upper housing may be fixed on an inner surface of the first sidewall. The lower housing may be fixed on an inner surface of the second sidewall and spaced apart from the bottom portion of the reinforcing housing by a predetermined distance.

The reinforcing housing may be formed of one selected from magnesium, magnesium alloy, stainless steel, and cold drawn steel. Alternatively, the bottom portion of the reinforcing housing may be formed of one selected from magnesium, magnesium alloy, stainless steel, and cold drawn steel and the first and second sidewalls of the reinforcing housing are formed of synthetic resin.

The OLED display device may further include an upper bezel located between the panel assembly and the reinforcing housing and a lower bezel located between the panel assembly and the upper housing.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
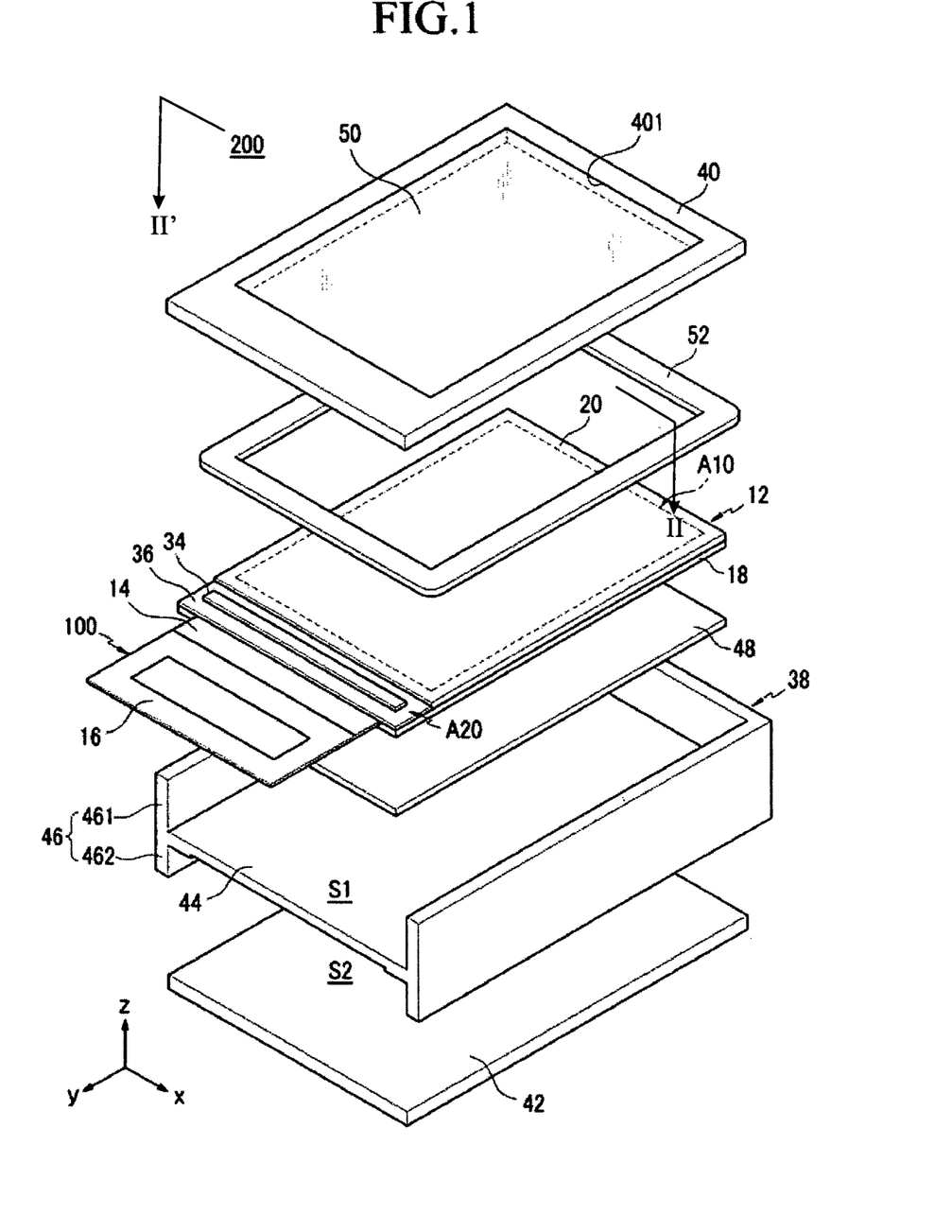
FIG. 1 is an exploded perspective view of an electronic constructed as a first exemplary embodiment of the present invention.
Figure 2:
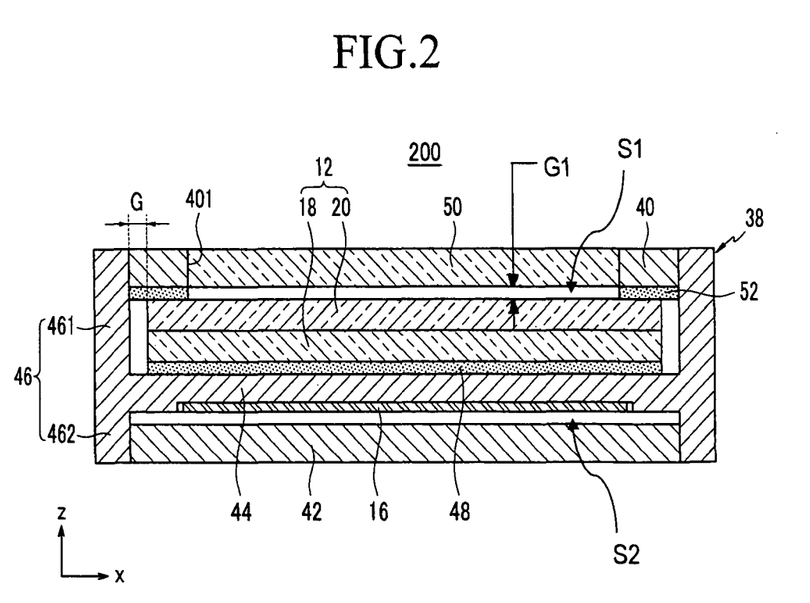
FIG. 2 is a sectional cross-sectional view of the electronic device of FIG. 1 taken along line II-II' in FIG. 1 when the electronic device is assembled.

FIG. 1 is an exploded perspective view of an electronic device constructed as a first exemplary embodiment of the present invention; and FIG. 2 is a sectional cross-sectional view of the electronic device of FIG. 1 taken along line II-II' in FIG. 1, when the electronic device is assembled.

Referring to FIGS. 1 and 2, an electronic device 200 of the present exemplary embodiment includes an OLED display device 100 and a housing enclosing OLED display device 100 and defining an exterior of electronic device 200.

OLED display device 100 includes a panel assembly 12 having a display region A10 and a pad region A20 and displaying an image on display region A10 and a printed circuit board (PCB) 16 electrically connected to panel assembly 12 via a flexible printed circuit board (FPCB) 14.

Panel assembly 12 includes a first substrate 18 and a second substrate 20 that is smaller than first substrate 18 and has a peripheral portion physically coupled to first substrate 18 by sealant. Display region A10 is defined at an overlapping region of first and second substrates 18 and 20, which is surrounded by the sealant. Pad region A20 is defined at an exterior of the sealant.

A plurality of sub-pixels are disposed in a matrix pattern at display region A10 of first substrate 18. Scan and data drivers (not shown) for driving the sub-pixels are located between display region A10 and the sealant or at the exterior of the sealant. Pad electrodes (not shown) for transferring electric signals to the scan and data drivers are disposed at pad region A20 of first substrate 18.

Figure 3:
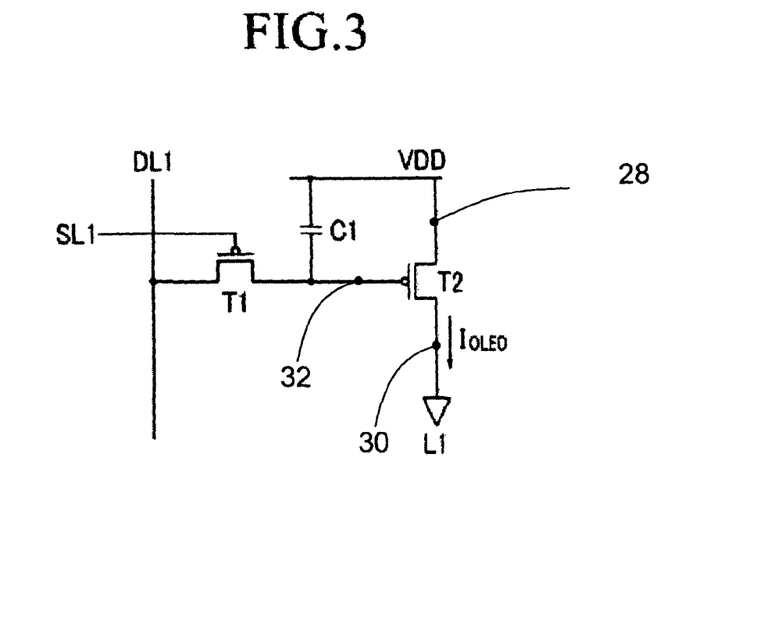
FIG. 3 is a circuit diagram of a sub-pixel circuit of a panel assembly depicted in FIG. 1.
Figure 4:
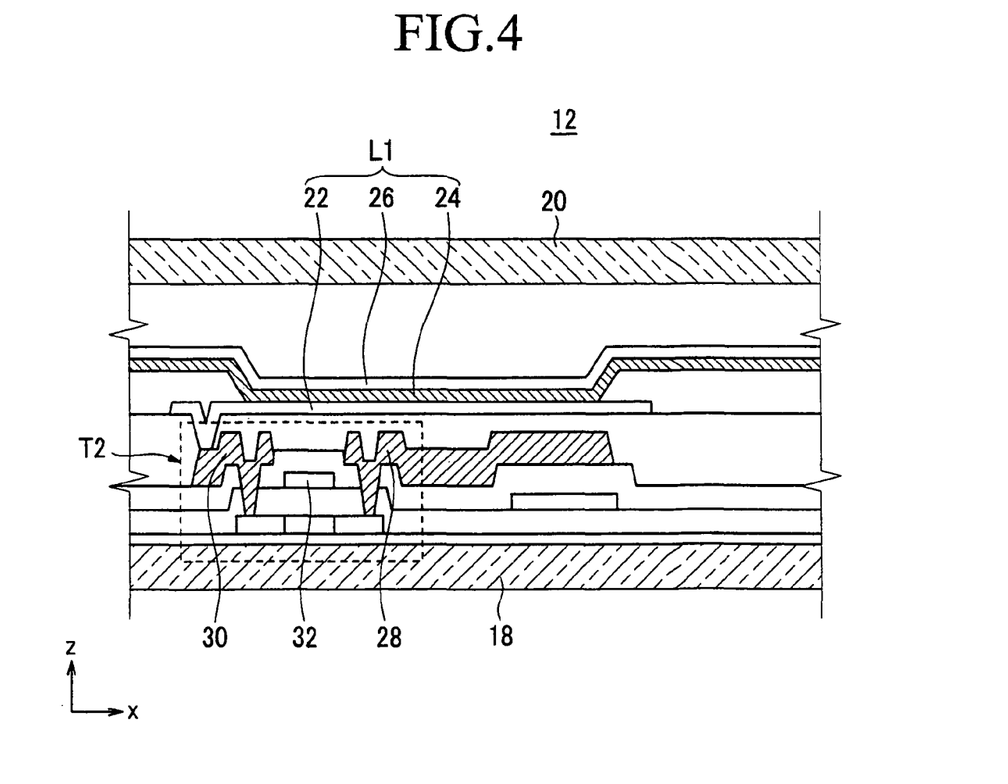
FIG. 4 is a partially enlarged cross-sectional view of a panel assembly depicted in FIG. 1.

FIG. 3 is a circuit diagram of a sub-pixel circuit of a panel assembly depicted in FIG. 1, and FIG. 4 is a partially enlarged cross-sectional view of a panel assembly depicted in FIG. 1.

Referring to FIGS. 3 and 4, each of the sub-pixels of panel assembly 12 includes an OLED L1 and a driving circuit unit. OLED L1 includes an anode electrode 22, an organic emission layer 24, and a cathode electrode 26. The driving circuit unit includes at least two thin film transistors and at least one storage capacitor C1. The at least two thin film transistors include at least one switching transistor T1 and at least one driving transistor T2.

The switching transistor T1 is connected to scan and data lines SL1 and DL1 to transfer a data voltage, which is an input from the data line DL1 in accordance with a switching voltage input to the scan line SL1, to the driving transistor T2. The storage capacitor C1 is connected to a power line VDD as well as to the switching transistor T1 to store a voltage corresponding to a difference between a voltage transferred from the switching transistor T1 and a voltage supplied from the power line VDD.

The driving transistor T2 is connected to both the power line VDD and the storage capacity C1 to supply an output current $I_{OLED}$, which corresponds to a square of a difference between a voltage stored in the storage capacity C1 and a threshold voltage, to the OLED L1 so that the OLED L1 can emit light by the output voltage $I_{OLED}$. Driving transistor T2 includes a source electrode 28, a drain electrode 30, and a gate electrode 32. Anode electrode 22 of OLED L1 is connected to drain electrode 30 of driving transistor T2. It should be construed that the above-described structure of the sub-pixels is exemplified only and may be variously modified.

Referring again to FIGS. 1 and 2, second substrate 20 is coupled to first substrate 18 by the sealant at a predetermined interval to protect the driving circuit unit and the OLEDs on first substrate 18 from an outer environment. A polarizing plate (not shown) for suppressing reflection of external light may be located on an external surface of the second substrate at display region A10. A moisture absorption member (not shown) may be attached on an inner surface of second substrate 20.

An integrated circuit chip 34 is mounted at pad region A20 of panel assembly 12 through a chip-on-glass (COG) method. FPCB 14 is also mounted at pad region A20 of panel assembly 12 through a chip-on-film (COF) method. A protective layer 36 is formed around integrated circuit chip 34 and FPCB 14 to cover and protect pad electrodes formed at pad region A20.

A variety of electronic elements (not shown) for processing driving signals are mounted on PCB 16. A connector (not shown) for transferring external signals to PCB 16 is also installed on PCB 16. FPCB 14 fixed at pad region A20 is folded toward an under surface of a reinforcing housing that will be described below.

The housing receiving OLED display device 100 includes a reinforcing housing 38 having first and second spaces S1 and S2 providing an impact absorbing function, an upper housing 40 disposed in first space S1 and coupled to reinforcing housing 38, and a lower housing 42 disposed in the second space S2 and coupled to reinforcing housing 38. Panel assembly 12 is located in first space S1 of reinforcing housing 38.

Reinforcing housing 38 enhances mechanical strength of the housing to minimize the damage of panel assembly 12 by external impact.

Reinforcing housing 38 includes a bottom portion 44 on which panel assembly 12 is disposed, and sidewalls 46, which extends from side edges of bottom portion 44, except for a side edge at which FPCB 14 is bent.

Each of sidewalls 46 includes a first sidewall 461 that extends from bottom portion 44 to face panel assembly 12 and defines first space SI with bottom portion 44, and a second sidewall 462 that extends from bottom portion 44 along an opposite direction to first sidewall 461 to define second space S2 with bottom portion 44. A height of first sidewall 461 may be greater than that of second sidewall 462.

Reinforcing housing 38 has an H-shaped section taken along a width direction (an x-direction in FIG. 2) of panel assembly 12. Reinforcing housing 38 may be formed of metal having relatively high strength, such as magnesium, magnesium alloy, stainless steel, cold drawn steel, and the like.

A shock absorption member 48 may be disposed between reinforcing housing 38 and bottom portion 44. Shock absorption member 48 includes a shock absorption layer and adhesive layers that are formed on respective top and under surfaces of the shock absorption layer to adhere panel assembly 12 to reinforcing housing 38. The shock absorption layer may be formed of sponge or urethane. Shock absorption member 48 attenuates an impact energy applied to panel assembly 12 from the external side to suppress the damage of panel assembly 12.

First sidewall 461 of reinforcing housing 38 is spaced apart from side surfaces of panel assembly 12 by a predetermined gap G (See FIG. 2). To this end, an area of bottom portion 44 of reinforcing housing 38 is greater than an area of panel assembly 12. When the external impact is applied to the sidewalls 46 of reinforcing housing 38, the gap between panel assembly 12 and first sidewall 461 performs to absorb the external impact and thus to prevent the impact energy applied to first sidewall 461 from being directly transferred to panel assembly 12.

Figure 5:
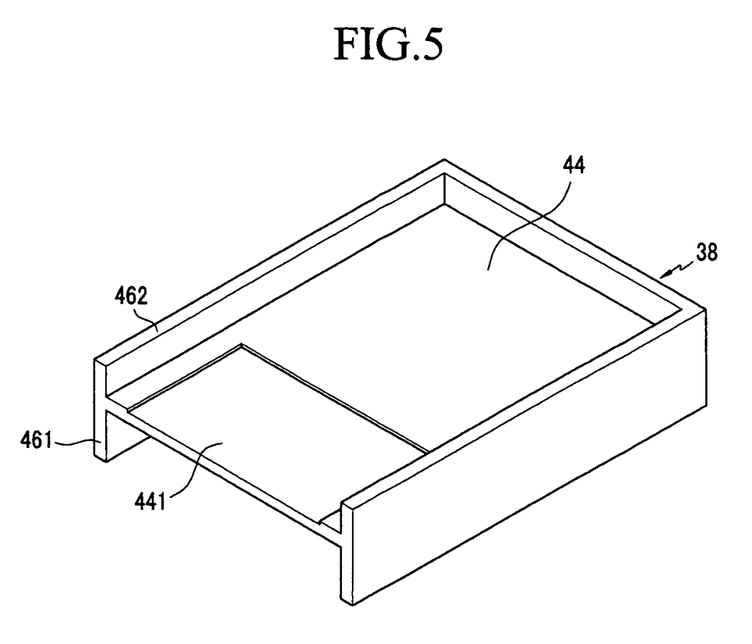
FIG. 5 is a perspective view of a reinforcing housing depicted in FIG. 1 compared to the reinforcing housing as shown in FIG. 1.

FIG. 5 is a perspective view of the reinforcing housing that is turned upside down compared to the reinforcing housing as shown in FIG. 1.

Referring to FIG. 5, a groove 441 for receiving PCB 16 may be formed on an under surface of bottom portion 44 of reinforcing housing 38. Therefore, when FPCB 14 fixed on pad region A20 is bent toward the under surface of bottom portion 44 while enclosing the side surface of bottom portion 44 of reinforcing housing 38, PCB 16 may be received in groove 441 formed on the under surface of bottom portion 44. PCB 16 may be stably fixed in groove 441 by a double-sided adhesive stripe (not shown).

Referring again to FIGS. 1 and 2, upper housing 40 is fixed on reinforcing housing 38 while covering panel assembly 12. That is, side surfaces of upper housing 40 are physically coupled to the corresponding first sidewall 461 of reinforcing housing 38. Upper housing 40 is provided with an opening 401 corresponding to display region A10. A transparent protecting member 50 is fitted in opening 401 so that a user can see display region A10. Transparent protecting member 50 is spaced apart from panel assembly 12 by a predetermined gap G1.

An impact absorption tape 52 may be formed around display region A10 between transparent protecting member 50 and panel assembly 12. Impact absorption tape 52 has an impact absorption layer for absorbing impact and adhesive layers formed on top and under surfaces of the impact absorption layer. The impact absorption layer may be formed of rubber.

Lower housing 42 is formed in a plate shape having a predetermined thickness and is fixed on reinforcing housing 38. Side surfaces of lower housing 42 are physically coupled to the corresponding second sidewall 462. Lower housing 42 is spaced apart from bottom portion 44 of reinforcing housing 38 by a predetermined distance. Upper housing 40, transparent protecting member 50, and lower housing 42 may be formed of synthetic resin in order to reduce the weight of electronic device 200.

In the above-described electronic device 200, reinforcing housing 38 is divided into first and second spaces S1 and S2 having the impact absorption function. Therefore, when external impact such as drop impact is applied to electronic device 200, first and second spaces S1 and S2 absorb the impact energy to reduce the impact energy transferred to panel assembly 12.

That is, when the external impact is applied to lower housing 42, the impact energy is partly absorbed by second space S2 and then transferred to panel assembly 12 via reinforcing housing 38. During the above process, the impact energy is further absorbed by reinforcing housing 38 and impact absorption member 48. Therefore, the impact energy that is finally transferred to panel assembly 12 is further reduced.

When the external force is applied to transparent protecting member 50 and/or upper housing 40, the impact energy is partially absorbed by impact absorption tape 52 and first space S1. The impact energy transferred to reinforcing housing 38 is further reduced by reinforcing housing 38 itself Subsequently, the impact energy is further reduced by impact absorption member 48 and the space defined between panel assembly 12 and first sidewall 461. Therefore, the impact energy that is finally transferred to panel assembly 12 is significantly reduced.

As described above, electronic device 200 of the present exemplary embodiment may minimize the damage of panel assembly 12, which may be caused by the external impact such as the drop impact, thereby enhancing mechanical reliability thereof.

Figure 6:
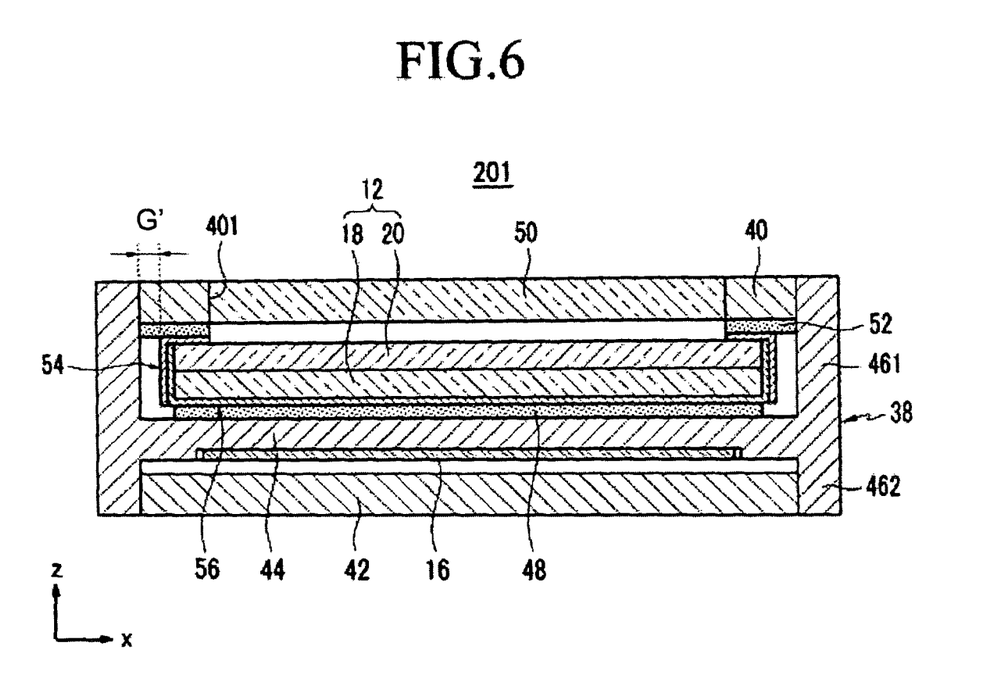
FIG. 6 is a sectional view of an electronic device constructed as a second exemplary embodiment of the present invention.
Figure 7:
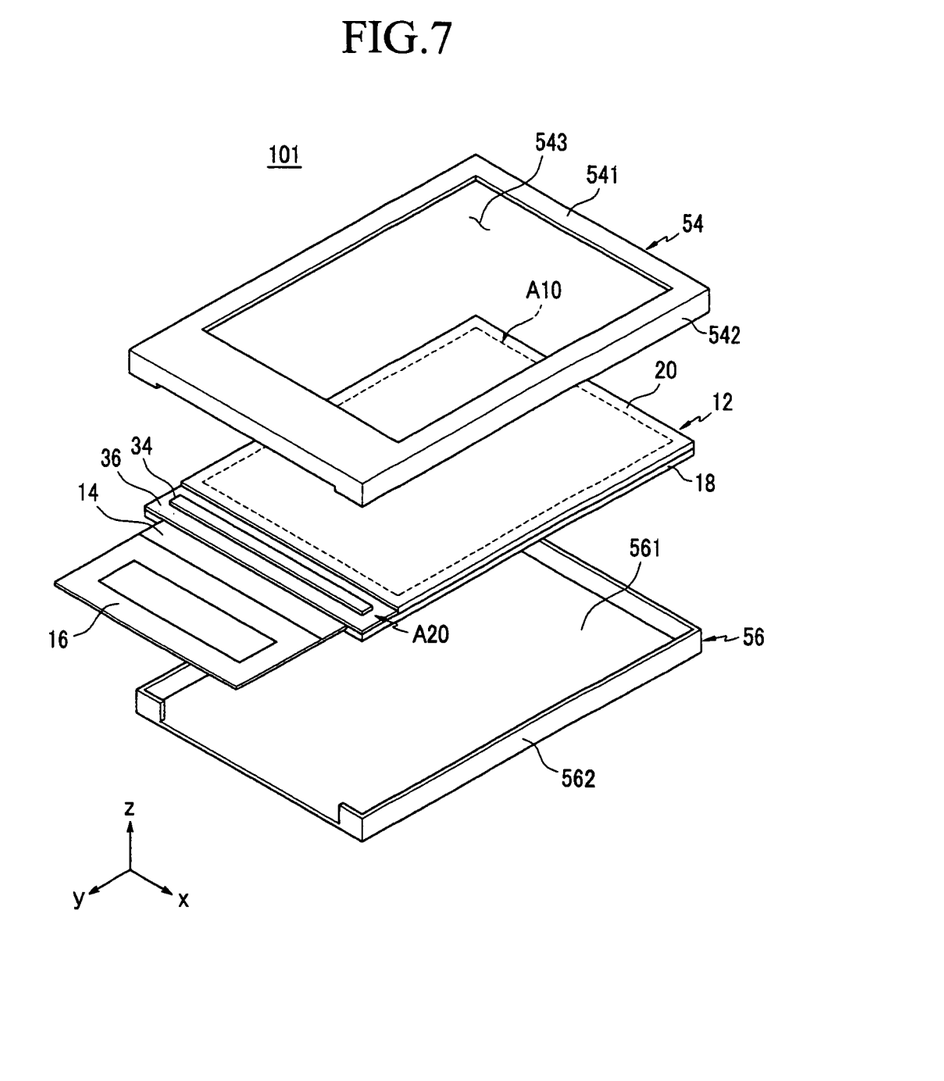
FIG. 7 is an exploded perspective view of an OLED display device depicted in FIG. 6.

FIG. 6 is a sectional view of an electronic device constructed as a second exemplary embodiment of the present invention and FIG. 7 is an exploded perspective view of an OLED display device depicted in FIG. 6.

Referring to FIGS. 6 and 7, an electronic device 201 of the present exemplary embodiment is identical to the electronic device of the first embodiment except that an OLED display device 101 further includes upper and lower bezels 54 and 56 enclosing panel assembly 12. In the first and second exemplary embodiments, like reference numbers are used to refer to like parts.

A lower bezel 56 includes a base portion 561 on which a panel assembly 12 is disposed and skirt portions 562, which extend from side edges of base portion 561 except for a side edge at which FPCB 14 is bent. An upper bezel 54 includes a cover portion 541 covering a top surface of panel assembly 12 and skirt portions 542 extending from side edges of cover portion 541. Cover portion 541 is provided with an opening 543 corresponding to a display region A10.

Double-sided adhesive stripes (not shown) are disposed between lower bezel 56 and panel assembly 12 and between upper bezel 54 and panel assembly 12 so as to integrate panel assembly 12 and lower bezel 56, and panel assembly 12 and upper bezel 54 respectively. Additional impact absorption members (not shown) may be further provided between lower bezel 56 and panel assembly 12 and between upper bezel 54 and panel assembly 12 to reduce impact energy transferred from upper and lower bezels 54 and 56 to panel assembly 12.

Skirt portions 542 of upper bezel 54 may be located outside of skirt portions 562 of lower bezel 56. Upper and lower bezels 54 and 56 are not limited to the above-described configuration but may be varied. For example, skirt portions 542 may be omitted from upper bezel 54. Upper and lower bezels 54 and 56 enhance mechanical strength of panel assembly 12 to minimize the damage of panel assembly 12 by external impact.

Skirt portions 542 of upper bezel 54 (or skirt portions 562 of lower bezel 56 when upper bezel 54 do not have skirt portions 542) are spaced apart from first sidewall 461 of a reinforcing housing 38 by a predetermined gap G' (see FIG. 6). Gap G' as shown in FIG. 6 may or may not be different from gap G as shown in FIG. 2. A space defined between reinforcing housing 38 and panel assembly 12 serves to absorb the impact energy transferred from reinforcing housing 38 to panel assembly 12.

Figure 8:
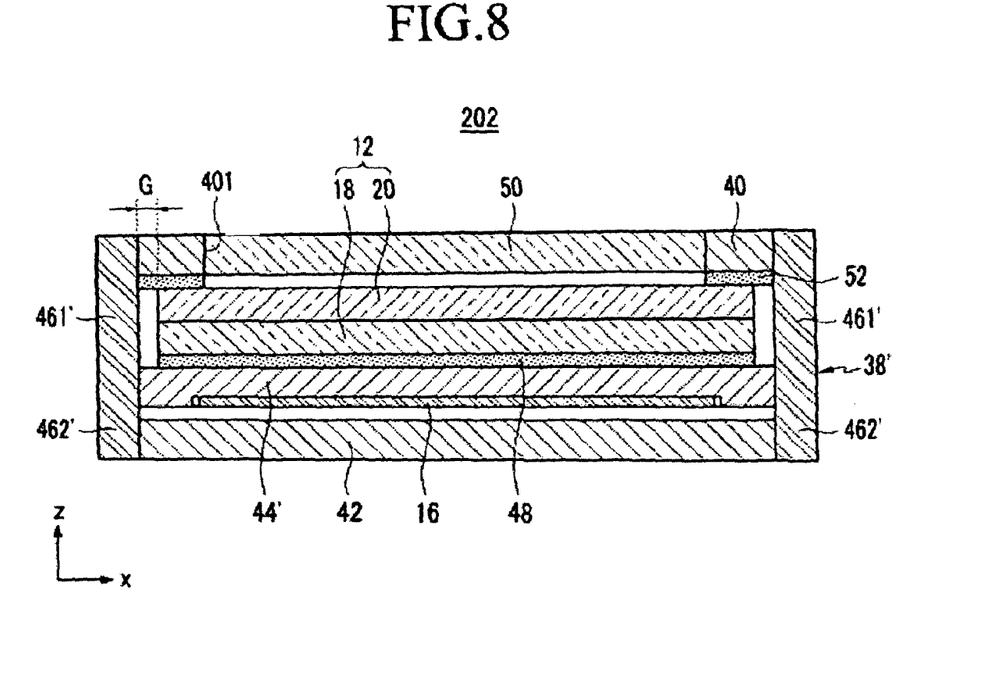
FIG. 8 is a sectional view of an electronic device constructed as a third exemplary embodiment of the present invention.

FIG. 8 is a sectional view of an electronic device constructed as a third exemplary embodiment of the present invention.

Referring to FIG. 8, an electronic device 202 of the present exemplary embodiment is identical to the electronic device of the first exemplary embodiment except that a bottom portion 44' of a reinforcing housing 38' is formed of metal and first and second sidewalls 461' and 462' of the reinforcing housing 38' are formed of synthetic resin. In the first and third exemplary embodiments, like reference numbers are used to refer to like parts.

Since reinforcing housing 38' is formed of two different materials (i.e., metal and synthetic resin), reinforcing housing 38' may be reduced in a weight while providing the similar impact absorption ability. Therefore, an overall weight of electronic device 202 may be reduced.

Figure 9:
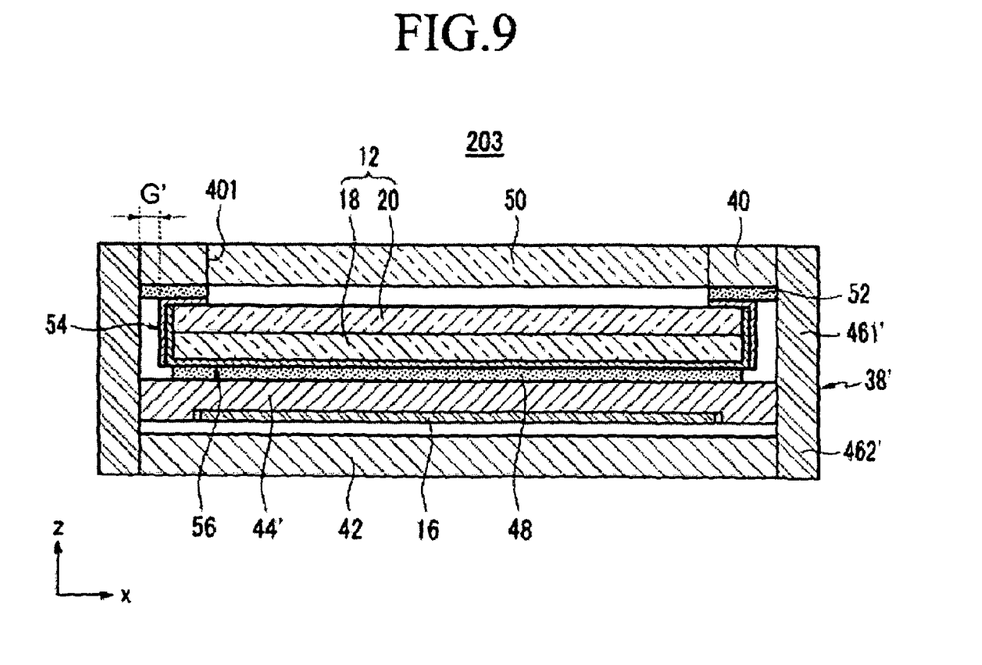
FIG. 9 is a sectional view of an electronic device constructed as a fourth exemplary embodiment of the present invention.

FIG. 9 is a sectional view of an electronic device constructed as a fourth exemplary embodiment of the present invention.

With reference to FIG. 9, an electronic device of the present exemplary embodiment is same as the electronic device of the third exemplary embodiment except that an OLED display device further includes upper and lower bezels 54 and 56 surrounding panel assembly 12. In the third and fourth exemplary embodiments, like reference numbers are used to refer to like parts. Since upper and lower bezels 54 and 56 have the same structures as those of the second exemplary embodiment, detailed description thereof will be omitted herein.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electronic device, comprising:
    an organic light emitting diode (OLED) display device comprising a panel assembly on which a plurality of OLEDs are formed, and a printed circuit board electrically connected to the panel assembly;
    a housing receiving the OLED display device;
    the housing comprising:
        a reinforcing housing having an impact absorption function and defining first and second spaces which are distinct and separated from each other;
        an upper housing disposed in the first space and coupled to the reinforcing housing; and
        a lower housing disposed in the second space and coupled to the reinforcing housing; and
    the panel assembly being disposed in the first space, the reinforcing housing comprising a bottom portion on which the panel assembly is disposed, the bottom portion of the reinforcing housing covering an entirety of a surface of the panel assembly which faces towards the lower housing, the reinforcing housing comprising a first sidewall extending from a side edge of the bottom portion toward the upper housing and a second sidewall extending from the side edge of the bottom portion toward the lower housing, the upper housing being fixed on an inner surface of the first sidewall, the lower housing being fixed on an inner surface of the second sidewall.

2. The electronic device of claim 1, in which the first sidewall is spaced apart from a side surface of the panel assembly by a predetermined gap.

3. The electronic device of claim 1, in which the panel assembly comprises a display region and a pad region; and
    the OLED display device comprises a flexible printed circuit board located between the pad region and the printed circuit board.

4. The electronic device of claim 3, in which the first and second sidewalls are located at side edges of the bottom portion except for a side edge where the pad region is disposed.

5. The electronic device of claim 4, in which the flexible printed circuit board is bent toward the second space such that the printed circuit board is located in the second space.

6. The electronic device of claim 5, in which the bottom portion is provided at a surface facing the second space with a groove for receiving the printed circuit board.

7. The electronic device of claim 1, further comprising an impact absorption member located between the panel assembly and the bottom portion of the reinforcing housing.

8. The electronic device of claim 1, in which the panel assembly further comprises a display region and a pad region, and the upper housing comprises a transparent protecting member corresponding to the display region.

9. The electronic device of claim 8, further comprising an impact absorption tape disposed along an outer circumference of the display region between the upper housing and the panel assembly.

10. The electronic device of claim 1, in which the lower housing is spaced apart from the bottom portion of the reinforcing housing by a predetermined distance.

11. The electronic device of claim 1, in which the reinforcing housing is formed of one of magnesium, magnesium alloy, stainless steel, and cold drawn steel.

12. The electronic device of claim 1, in which the bottom portion is formed of one of magnesium, magnesium alloy, stainless steel, and cold drawn steel and the first and second sidewalls are formed of synthetic resin.

13. The electronic device of claim 1, in which the reinforcing housing is formed of one of magnesium, magnesium alloy, stainless steel, and cold drawn steel.

14. The electronic device of claim 1, in which the OLED display device further comprises an upper bezel located between the panel assembly and the upper housing and a lower bezel located between the panel assembly and the reinforcing housing, with the upper bezel and lower bezel being disposed spaced apart from the reinforcing housing and the upper housing.

15. The electronic device of claim 14, in which the bottom portion is formed of one of magnesium, magnesium alloy, stainless steel, and cold drawn steel and the first and second sidewalls are formed of synthetic resin.

16. An electronic device, comprising:
   an organic light emitting diode (OLED) display device comprising a panel assembly on which a plurality of OLEDs are formed, and a printed circuit board electrically connected to the panel assembly;
   a housing receiving the OLED display device;
   the housing comprising:
      a reinforcing housing having an impact absorption function and a bottom portion defining first and second spaces which are distinct and separated from each other;
      an upper housing disposed within the first space and physically coupled to the reinforcing housing, and the upper housing facing to and being spaced apart from the panel assembly by a predetermined distance; and
      a lower housing disposed within the second space and physically coupled to the reinforcing housing; and
   the panel assembly being disposed within the first space with edges of the panel assembly being spaced apart from the reinforcing housing, the reinforcing housing comprising a bottom portion on which the panel assembly is disposed, the bottom portion of the reinforcing housing covering an entirety of a surface of the panel assembly which faces towards the lower housing, the reinforcing housing comprising a first sidewall extending from a side edge of the bottom portion toward the upper housing and a second sidewall extending from the side edge of the bottom portion toward the lower housing, the upper housing being fixed on an inner surface of the first sidewall the lower housing being fixed on an inner surface of the second sidewall.

* * * * *